(12) United States Patent
Landis et al.

(10) Patent No.: US 9,953,807 B2
(45) Date of Patent: Apr. 24, 2018

(54) METHOD FOR PRODUCING PATTERNS BY ION IMPLANTATION

(71) Applicant: COMMISSARIAT A L'ENERGIE ATOMIQUE ET AUX ENERGIES ALTERNATIVES, Paris (FR)

(72) Inventors: Stefan Landis, Tullins (FR); Sebastien Barnola, Villard Bonnot (FR); Thibaut David, Goncelin (FR); Lamia Nouri, Le Kremelin Bicetre (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/612,680

(22) Filed: Jun. 2, 2017

(65) Prior Publication Data
US 2017/0352522 A1 Dec. 7, 2017

(30) Foreign Application Priority Data

Jun. 3, 2016 (FR) ..................... 16 55090

(51) Int. Cl.
*H01J 37/317* (2006.01)
*H01J 37/305* (2006.01)

(52) U.S. Cl.
CPC ...... *H01J 37/3175* (2013.01); *H01J 37/3053* (2013.01); *H01J 37/3171* (2013.01); *H01J 2237/08* (2013.01)

(58) Field of Classification Search
None
See application file for complete search history.

(56) References Cited

U.S. PATENT DOCUMENTS

| 6,207,517 B1 | 3/2001 | Muller |
| 6,365,525 B2 | 4/2002 | Muller |

(Continued)

OTHER PUBLICATIONS

French Preliminary Search Report issued Jan. 26, 2017 in French Application 16 55090 filed Jun. 3, 2016 (with English Translation of Categories of cited documents and Written Opinion).

(Continued)

*Primary Examiner* — Asok K Sarkar
(74) *Attorney, Agent, or Firm* — Oblon, McClelland, Maier & Neustadt, L.L.P.

(57) ABSTRACT

A method for forming reliefs on the surface of a substrate, including a first implantation of ions in the substrate according to a first direction; a second implantation of ions in the substrate according to a second direction that is different from the first direction; at least one of the first and second implantations is carried out through at least one mask having at least one pattern; an etching of areas of the substrate having received by implantation a dose greater than or equal to a threshold, selectively to the areas of the substrate that have not received via implantation a dose greater than said threshold; the parameters of the first and second implantations being adjusted in such a way that only areas of the substrate that have been implanted both during the first implantation and during the second implantation receive a dose greater than or equal to said threshold.

22 Claims, 9 Drawing Sheets

(56) References Cited

U.S. PATENT DOCUMENTS

| | | | | |
|---|---|---|---|---|
| 2002/0050573 A1* | 5/2002 | Suguro | ............... | H01J 37/3171 |
| | | | | 250/492.21 |
| 2009/0139449 A1* | 6/2009 | Suguro | ................. | B82Y 10/00 |
| | | | | 118/504 |
| 2015/0214099 A1 | 7/2015 | Grenouillet et al. | | |
| 2016/0181465 A1* | 6/2016 | Adibi | ................... | C23C 14/042 |
| | | | | 438/61 |

OTHER PUBLICATIONS

Sang Wan Kim, et al. "Enhanced Patterning by Tilted Ion Implantation", SPIE—International Society for Optical Engineering, vol. 9777, 2016, 6 pages.

* cited by examiner

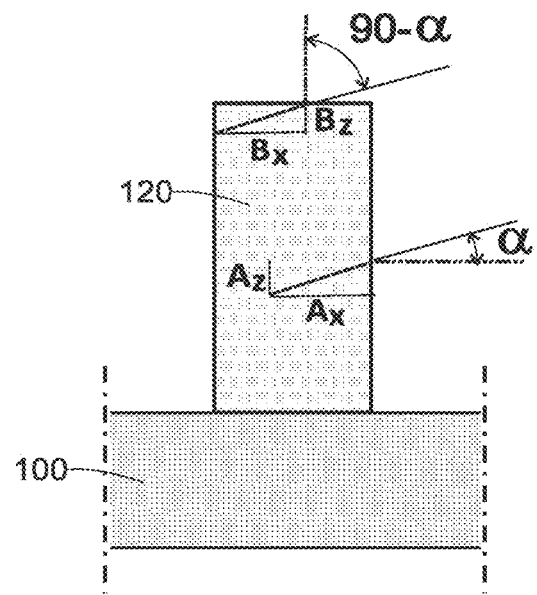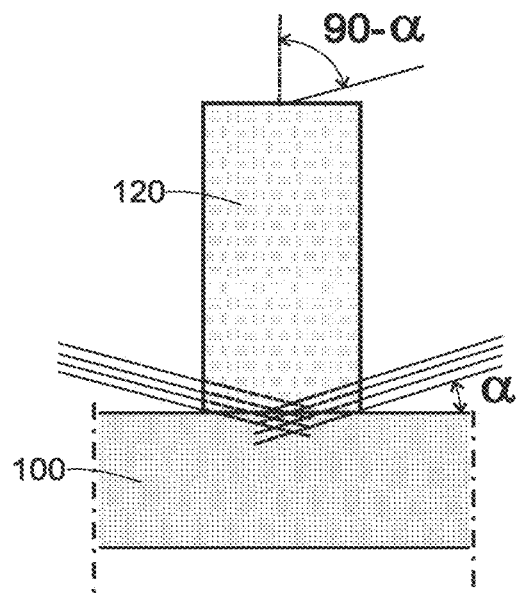
Figure 5c               Figure 5d
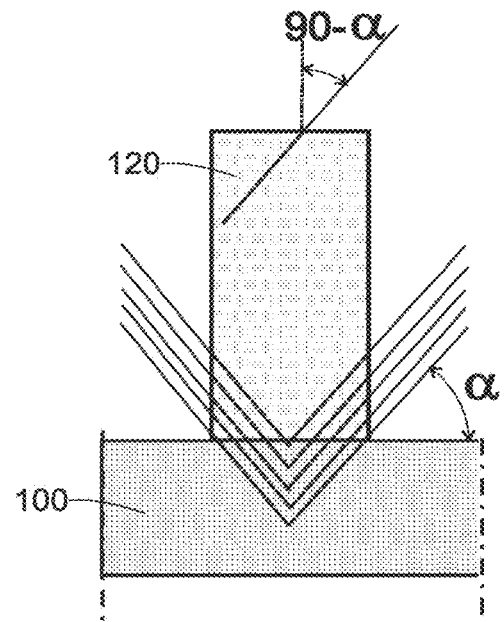
Figure 5e

METHOD FOR PRODUCING PATTERNS BY ION IMPLANTATION

TECHNICAL FIELD OF THE INVENTION

This invention relates to a method for structuring the surface of a substrate and more generally a method for producing patterns on the surface of a substrate.

The invention has for advantageous but not limiting applications microelectronics, optics or optonics.

PRIOR ART

The possibility of obtaining slices or plates ("wafers") and substrates, with a structured surface ("patterned substrate") i.e. of which the surface is at least partially covered with patterns in relief, can be very advantageous. This is the case in particular for most devices of the optical or optoelectronic type and in particular light-emitting diodes (LEDs) of which the efficiency in converting an electric current into light is highly dependent on the surface condition of the substrate from which they are manufactured.

The methods that exist for structuring substrates comprise many steps of lithography, combining for example nanometric printing and steps of photolithography.

These existing methods make it possible to obtain only relatively simple forms and with little freedom on the patterns obtained, except for substantially increasing the complexity and therefore the cost of these methods.

There is therefore a need consisting in proposing a solution in order to obtain in a reproducible manner and inexpensively patterns that are possibly complex on the surface of a substrate.

An object of the invention consists in proposing such a solution.

The other objects, characteristics and advantages of this invention shall appear when examining the following description and the accompanying drawings. It is understood that other advantages can be incorporated.

SUMMARY OF THE INVENTION

In order to achieve this objective, according to an embodiment this invention provides a method of forming reliefs on the surface of a substrate, characterized in that it comprises at least the following steps:
  at least one first implantation of ions in the substrate according to a first direction;
  at least one second implantation of ions in the substrate according to a second direction that is different from the first direction;
  at least one of the first and second implantations is carried out through at least one mask having at least one pattern;
  an etching of areas of the substrate having received by implantation a dose greater than or equal to a threshold, selectively to the areas of the substrate that have not received via implantation a dose greater than said threshold.

The parameters of the first and second implantations, in particular their respective directions, being adjusted in such a way that only areas of the substrate that have been implanted both during the first implantation and during the second implantation receive a dose greater than or equal to said threshold.

As such, the method according to this invention makes it possible to obtain in a particularly simple way patterns that may be complex.

For example it is possible to obtain three-dimensional patterns or analog patterns, i.e. patterns that have a continuous profile or patterns with several levels of height or of depth. Most of the existing methods, unless they are very complex, make it possible to obtain only binary patterns, i.e. with a single level of height or of depth.

Moreover this method makes it possible to define the patterns sought with a large freedom of choice. Furthermore this method makes it possible to control simply and in a very reproducible manner the geometrical characteristics of the patters of the substrate.

The method according to the invention is particularly advantageous for carrying out diffraction gratings or absorption gratings, for example for the LED or photovoltaic market.

In particular the method according to the invention makes it possible to carry out in a very reproducible manner patterns of small size on the surface of the substrates from which the LEDs are manufactured.

Optionally, the method according to the invention can have at least any one of the following optional characteristics:
According to an embodiment, the first and second implantations are each carried out through at least one mask.
According to an embodiment, the at least one pattern of the mask used during the first implantation is different from the at least one pattern of the mask used during the second implantation.
According to an embodiment, the first and second implantations are carried out through the same mask, with the method comprising at least one additional implantation carried out through a mask that is different from the one used during the first and second implantations.
Alternatively at least one of the first and second implantations is carried out full wafer and without a mask.
According to an embodiment, a sacrificial layer is deposited above the substrate and at least one among the first and the second implantations is carried out through said sacrificial layer.
According to an embodiment, the entire sacrificial layer is removed after the second implantation.
According to an embodiment, the sacrificial layer is an anti-reflective coating (BARC).
According to an embodiment, the thickness of the sacrificial layer is chosen and at least one among the first and the second implantations are carried out in such a way that first areas located under the mask are implanted both during the first implantation and during the second implantation, receive a dose greater than or equal to said threshold and extend solely in the sacrificial layer.
As such these first regions do not extend into the substrate. The patterns of these regions will not as such be etched into the substrate.
This makes it possible to smooth the profile obtained without having to carry out a thinning operation, such as a mechanical-chemical polishing in order to remove the shallowest reliefs.
According to an embodiment, the thickness of the sacrificial layer as well as at least one among the first and the second implantations are carried out in such a way that second areas located under the mask are implanted both during the first implantation and during the second implantation by receiving a dose that is greater than or equal to said threshold, with said second regions extending in the sacrificial layer and in the substrate.

As such these second regions extend in the substrate.

According to an embodiment, the substrate is crystalline and at least one of the first and second implantations is carried out in such a way as to modify the physical structure of the substrate in order to render it amorphous. According to an embodiment, this implantation comprises the implantation of ions that are heavier than hydrogen (H), such as argon (Ar), silicon (Si) or Boron (B) ions, with an energy that is sufficient to render the implanted areas amorphous. For example, in order to carry out a physical modification of the substrate, it is possible to use ions of which the atomic mass is greater than equal to that of Boron.

According to an embodiment, at least one among the first and the second implantations is carried out in such a way as to chemically modify the substrate. According to an embodiment, this implantation carried out in such a way as to chemically modify the substrate comprises the implantation of hydrogen (H) and/or of oxygen ions in order to chemically modify the substrate.

According to an embodiment, said implantation carried out in such a way as to render the implanted areas amorphous is the first implantation and wherein said implantation carried out in such a way as to chemically modify the substrate is the second implantation.

According to an alternative embodiment, said implantation carried out in such a way as to chemically modify the substrate is the first implantation and wherein said implantation carried out in such a way as to render the implanted areas amorphous is the second implantation.

According to an embodiment, at least some of the areas receiving a dose greater than or equal to said threshold are located under a pattern of the mask during at least one of the first and second implantations.

According to an embodiment, at least one of the first and second directions of implantation is perpendicular to a main plane wherein the substrate extends.

According to an embodiment, both the first and the second direction of implantation are inclined with respect to a direction perpendicular to a main plane wherein the substrate extends.

According to an embodiment, the substrate is made from a material taken from one of the following materials: silicon (Si), silicon-germanium (SiGe), sapphire, GaN, SiC, and quartz.

According to an embodiment, the substrate is porous.

According to an embodiment, the parameters of the first and second implantations, in particular their respective directions, are adjusted in such a way that some areas of the substrate do not receive any dose during at least one among the first and the second implantations.

As such by inclining one of the implantations enough, the patterns of the mask prevent the ions from penetrating into the substrate in certain areas.

As such, in certain areas, the substrate retains its integrity while in other areas thereof it is modified and possible etched.

According to an embodiment, the parameters of the first and second implantations, in particular their directions and their energy, are adjusted in such a way that during at least one among the first and the second implantations, ions penetrate into the substrate without passing through the mask.

The invention as such described a method for the three-dimensional structuring of the surface of the substrate comprising an initial step wherein a mask with two-dimensional patterns is formed on the surface of said substrate, and wherein the surface of said substrate is implanted through the mask of 2D patterns using an ion beam, the ion beam inclined. A 3D implantation is as such obtained on the surface of the substrate due to the screen formed by the mask of 2D patterns passed through by the beam with an inclination that is different from the normal.

Another object of this invention relates to a microelectronic device comprising a substrate that has a surface carrying patterns obtained according to the method of the invention. The term microelectronic device means any type of device carried out with microelectronic means. These devices encompass in particular in addition to devices with a purely electronic finality, micromechanical or electromechanical devices (MEMS, NEMS, etc.) as well as optical or optoelectronic devices (MOEMS, etc.)

BRIEF DESCRIPTION OF FIGURES

The purposes and objects as well as the characteristics and advantages of the invention will appear more clearly in the detailed description of an embodiment of the latter which is shown by the following accompanying drawings wherein.

Figure 1A:
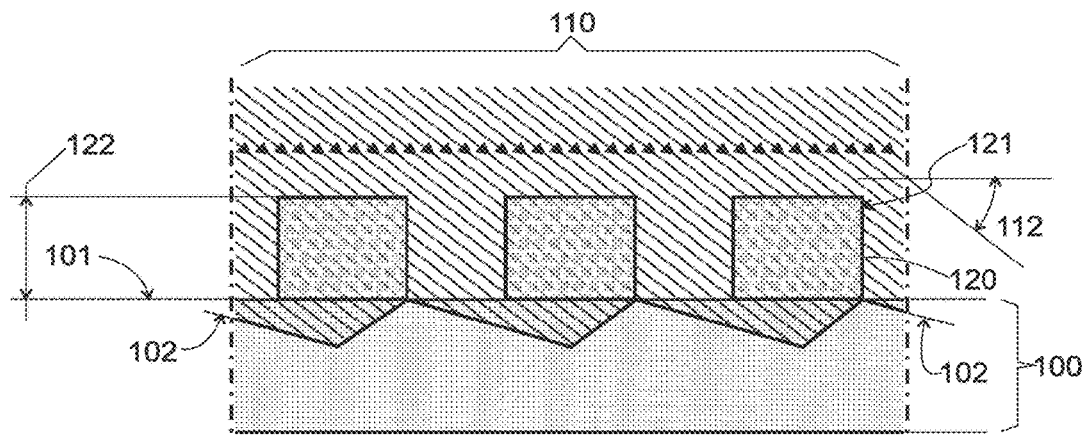
FIG. 1, comprised of FIGS. 1a to 1e, shows a first embodiment in order to obtain a structured surface according to an example of the method of the invention using an implantation of species through a mask.

The drawings are given by way of examples and do not limit the invention. They constitute diagrammatical block representations intended to facilitate the comprehension of the invention and are not necessarily to the scale of practical applications. In particular the relative thicknesses of the substrate, of the mask and of its patterns are not representative of reality.

DETAILED DESCRIPTION OF THE INVENTION

It is stated that in the framework of this invention, the term "on", "surmount", "cover" or "underlying" or their equivalents do not necessarily mean "in contact with". As such for example, the deposition of a first layer on a second layer, does not necessarily mean that the two layers are directly in contact with one another but this means that the first layer at least partially covers the second layer by being either directly in contact with it or by being separated from it by at least one other layer or at least one other element.

In the framework of this invention, the term resin qualifies an organic or organo-mineral material that can be shaped by exposure to a beam of electrons, photons or X-rays or mechanically.

In the framework of this invention, the term three-dimensional pattern designates a pattern that has in the substrate, at least two levels of depth below the upper surface of the substrate when the pattern is hollow or at least two levels of height above an upper surface of the substrate when the pattern is protruding. This appears clearly in FIG. 1e for example which will be described in detail in what follows.

In this patent application, the thickness is taken according to a direction perpendicular to the main surface 101 of the substrate 100 to be etched. In FIGS. 1 to 3, the thickness is taken according to the vertical.

Likewise, when it is indicated that an element is located in line with another element, this means that these two elements are both located on the same line perpendicular to the main plane of the substrate 100, or on the same line oriented vertically in the figures FIG. 1, comprised of FIGS. 1a to 1e, shows a first way of obtaining a structured surface according to the method of the invention.

This method is carried out using a stack comprising at least one substrate 100 surmounted by a mask 121. The substrate 100 can also be qualified as a layer to be etched.

The substrate 100 may or may not be self-supporting. It may or may not rest on one or several other layers. The substrate 100 can be monocrystalline, polycrystalline or amorphous according to the applications considered. The substrate is typically made of a material comprising at least one of the following materials: silicon (Si), silicon-germanium (SiGe) sapphire, SiN, GaN, SiC, and quartz. For example the substrate 100 can be made of silicon (Si), silicon-germanium (SiGe) preferably monocrystalline or polycrystalline. The substrate 100 can also be made of quartz, or sapphire.

The substrate 100 can be porous. In the framework of this invention, the term porous substrate designates a substrate of which the presence of a void is greater than 5% by volume and preferably between 5 and 10%. This can for example be porous SiOCH.

As shown in FIG. 1a there is first of all a first implantation of species through the surface 101 of the substrate 100. The implantation, in the form of an ion beam 110, is carried out conventionally by implementing techniques and conventional means and in particular by using implanters and plasma etchers.

According to this embodiment shown in FIG. 1, the ion beam is not directed perpendicularly to the plane defined by the surface 101 of the substrate but is applied with an inclination 112, also noted as α, in relation to this plan.

This implantation is carried out through a mask 121 carrying patterns 120. According to a non-limiting example, these patterns 120 are carried out using a layer of photosensitive or heat-sensitive resin by implementing one or the other of the conventional techniques of photolithography or nanometric printing developed for decades by the microelectronics industry or by combining them.

According to an alternative embodiment, the mask is a hard mask. It can then be carried out according to the following steps: deposition of the material forming the mask, (for example SiN or SiO2, etc.); then deposition of a layer of resin and formation of patterns via lithography in the resin; then opening of the mask; then removal of the resin.

In the implanter or plasma etcher used, a sufficient quantity of energy is communicated to the beam of ions 110 so that the path of the latter is not substantially deviated by the patterns 120. The latter however constitute an obstacle that partially form a screen to the propagation of the ion beam and as such makes it possible to obtain an implantation at variable depths from the surface of the substrate 101. The implantation of the ions at the end of this first implantation as such defines the profile 102 shown in FIG. 1a. As shall be seen in what follows, generally, the shape and the spacing of the patterns are adapted to the profile 102 of implantation that is sought to be obtained.

Note here that the nature of the resin, the dimension of the patterns 120, the nature of the ions implanted as well as the conditions of implantation are chosen in such a way that there is no noticeable consumption of the resin due to the implantation operation itself.

Typically, the patterns 120 are two-dimensional (2D) or binary patterns, with substantially rectangular or square shapes obtained very simply via full etching of a superficial layer of resin 122. These two-dimensional (2D) or binary patterns make it possible however to obtain a three-dimensional (3D) profile 102 of the implantation due to the inclination applied to the ion beam and to the masking effect produced by the patterns.

Figure 1B:
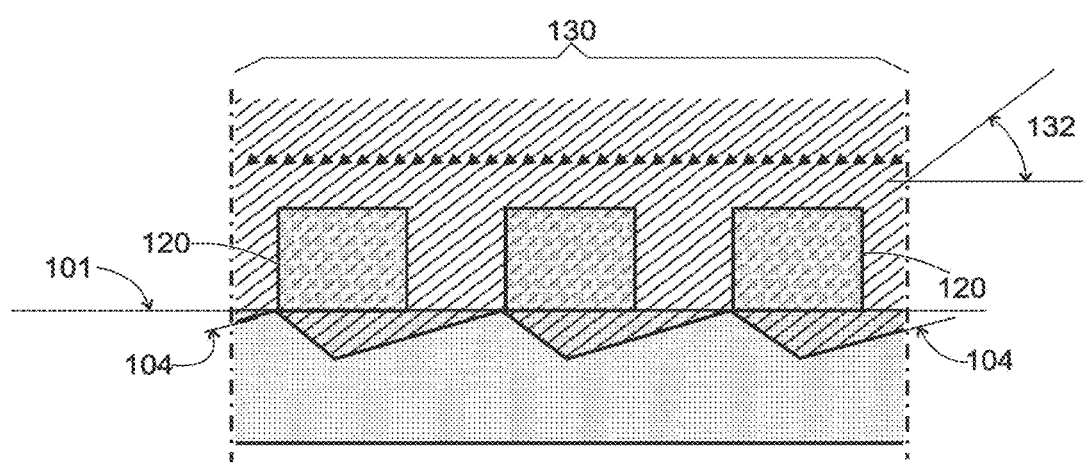

FIG. 1b shows the result of a second implantation which can optionally be practiced by using the same patterns 120 forming a screen to the ion beam 130. In the example shown in FIG. 1b, the angle of incidence 132 is chosen to be substantially symmetrical, in relation to a perpendicular to the plane of the substrate 101, to that of the first implementation.

In this case shown in FIG. 1b, the profile 104 is thus obtained which is itself the symmetrical of the profile 102 of the first implantation 102.

Figure 1C:
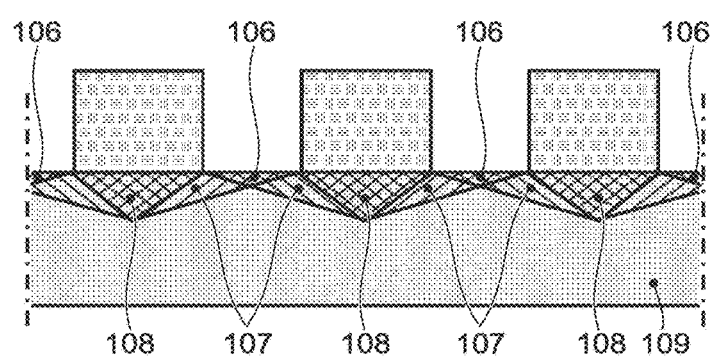

The result of these two implantations is shown in FIG. 1c.

Note however that there is no constraint on the angle of incidence of the second implantation that can be chosen freely with as the sole criterion of choice the final profile of implantation desired in the substrate 100.

In particular this angle of incidence can be equal to 90°. In this case the direction of implantation is perpendicular to the plane of the substrate 101.

More preferably the direction of implantation chosen during the second implantation is different from the direction of implantation chosen during the first implantation.

Note also that it is possible to have only implantation which is carried out through a mask 121. Indeed, the first or the second implantation can be carried out full wafer without a mask.

According to another embodiment not shown the mask used during the first implantation is different from the one used during the second implantation.

After the first or the second implantations, some areas 106, 108 are implanted both during the first implantation and during the second implantation.

In a non-limiting example shown, these areas are located between the patterns (areas 106) and or under the patterns (108).

The conditions of implantation are adjusted so that only the areas that receive a dose of ions both during the first implantation and during the second implantation exceeding a threshold beyond which the material of the substrate is sufficiently modified to become clearly more sensitive to an etching than the non-modified material or modified with a dose less than the threshold.

As such, during a subsequent t etching, typically a chemical etching, the areas implanted twice can be etched with respect to the areas that that were implanted only once or which were not implanted at all.

FIG. 1c shows the areas that were implanted only once (areas 107) and the areas that were not implanted at all (areas 109).

Figure 1D:
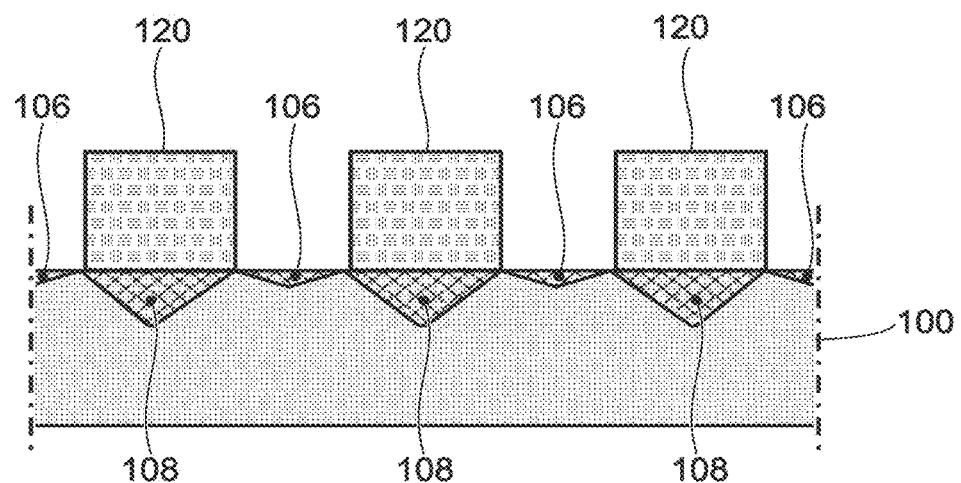

The areas 106, 108 that have received implantation twice and alone are able to be etched in this example, are shown in FIG. 1d.

Then a conventional step of removing the mask 121 carrying the resin patterns 120 is carried out.

Afterwards or simultaneously, a wet etching is carried out of these modified areas 106, 108 with a dose greater than the threshold. The stopping of the etching takes place automatically at the border between areas that have been implanted twice and areas only once or that have not been implanted. The end of the etching can also be controlled by time if the selectivity is sufficient between on the one hand the areas modified 106, 108 with a dose exceeding the threshold and on the other hand the non-modified areas 106, 108 with a dose greater than the threshold.

Figure 1E:
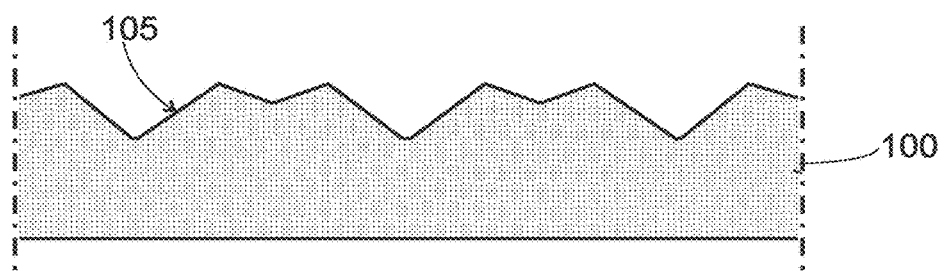

A structuring of the surface of the substrate 100 and a profile 105 as shown in FIG. 1e are then obtained.

For example, it is observed that between two wafers of silicon, with one having been subjected to a single implantation and the implanted twice in identical conditions, a wet etching using a bath of potassium hydroxide (KOH) diluted to 20% and comprising a surfactant (triton X-100) is effective only in the case of the double implantation. The implantation, simple or double, is carried out in the same conditions, i.e.: implantation of argon (Ar) ions with an energy of 75 kilo electronvolts (keV) and a dose of $10^{15}$ atoms per $cm^2$, impacting a thickness of 120 nm of material from the surface, and a double implantation of hydrogen (H) ions with a dose of $10^{15}$ atoms per $cm^2$ and an energy respectively of 3 keV and 7 keV in order to cover the entire depth to be modified (i.e. the 120 nm modified by the implantation of Ar).

This embodiment advantageously makes it possible to obtain a very good etching.

In the framework of the development of this invention it was noticed that a particularly precise definition of the patterns is obtained when the following is carried out:

an implantation during which the ions modify the physical structure of the crystalline substrate in order to render it amorphous. This requires the implantation of relatively heavy ions (at least as heavy as boron) such as argon (Ar), silicon or boron ions;

simultaneously or after the amorphization of the substrate, an implantation during which the ions modify the chemistry of the substrate. This requires the implantation of ions that are relatively light such as hydrogen (H) and/or oxygen ions. These light ions are housed in the crystalline substrate without modifying the crystallographic structure thereof but by creating chemical bonds (in particular Si—H) which will be able to oxidize easily.

Note that the implantation carried out in order to amorphize the substrate 100 can be carried out full wafer and without a mask over the entire surface of the substrate 100. Then the areas to be etched are defined by carrying out a chemical modification of the substrate 100 through the patterns 120 of one or several masks 121.

By way of example, for a silicon substrate, the threshold beyond which the areas implanted at least during two implantations can be etched selectively to the areas that have received a dose less than the threshold is the following:

For an etching with a base of KOH or TMAH
    at concentration in hydrogen ions of $10^{20}$ atoms per $cm^3$ and
    at a concentration in argon ions of $10^{18}$ atoms per $cm^3$.

Figure 2A:
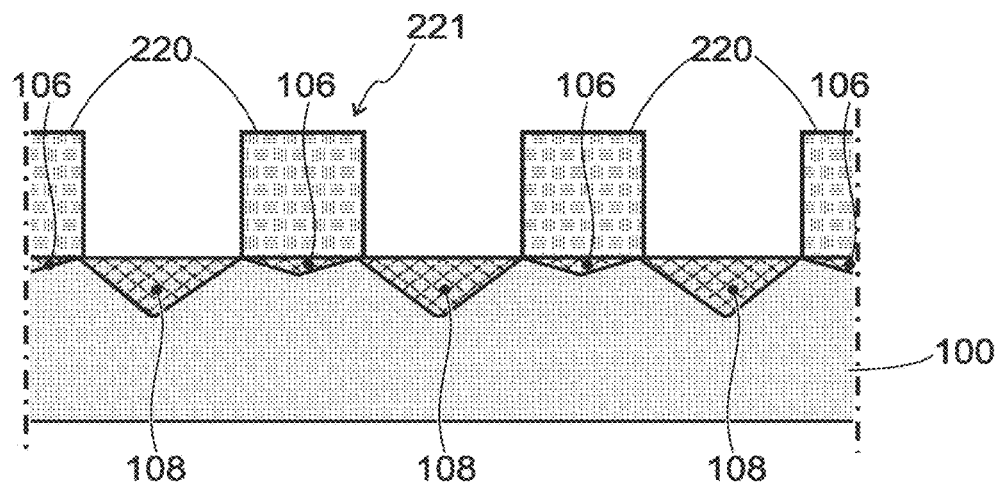
FIG. 2, comprised of FIGS. 2a to 2c, shows a second embodiment of the invention wherein the preceding steps are repeated with a second mask.
Figure 2B:
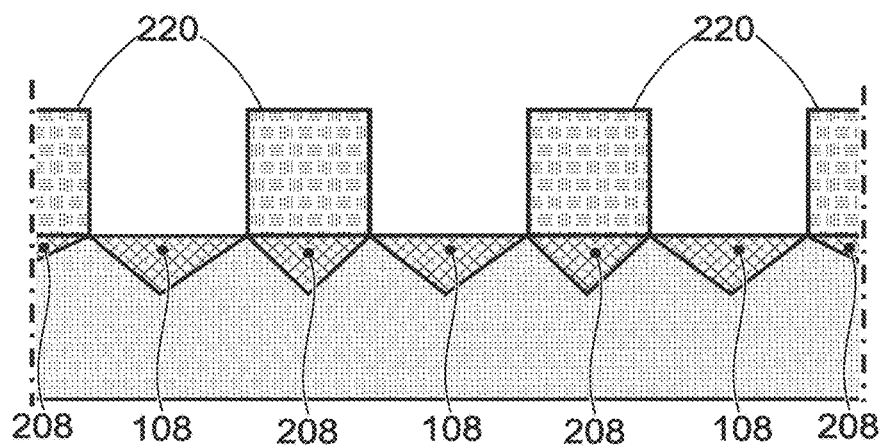
Figure 2C:
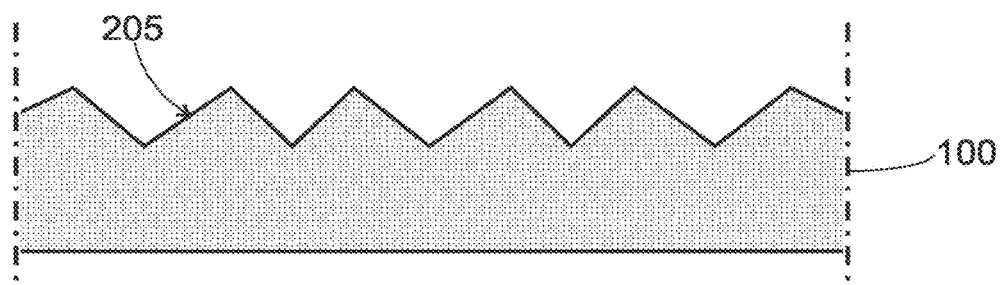

FIG. 2 comprised of FIGS. 2a to 2c shows a second embodiment of the invention. In this case, the steps shown in FIGS. 1a to 1d are carried out.

Then the mask 121 is removed. At this step the substrate 100 is not etched.

Additional steps described in FIGS. 2a to 2c are then carried out.

The first additional step in this case consists therefore in creating other patterns 220 intended to form another mask 221, this time aligned on the shallowest areas implanted i.e. the areas 106, located in line with the intervals separating the preceding patterns 120. This is shown in FIG. 2a where there are all of the areas that were already implanted during the steps corresponding to FIGS. 1a to 1d, i.e. the areas 106 and 108. The new patterns 220 are carried out in a manner similar to what was described for FIG. 1b y using the conventional techniques of photolithography.

In order to obtain patterns 220 aligned with respect to the preceding patterns 120 recourse can be had to several techniques. It is possible for example to implement the technique of lift off, i.e. by lifting off the patterns after the deposition of a layer intended to form the patterns 220.

Recourse can also be had to conventional equipment for advanced lithography which makes it possible to have alignment precision (overlay) less than 10 nm.

Using new patterns 220, by repeating all of the operations that have already been described for FIGS. 1a to 1d the result shown in FIG. 2b is obtained comprising the implanted areas 108 and 208 which are then substantially of the same shape, dimension and depth in that the intervals between the patterns 120 were initially chosen to be identical to the width of these patterns.

As shown in FIG. 2c a structuring 205 that is much more regular of the surface of the substrate 100 is as such obtained after etching.

The successive implantations are carried out in such a way that only the areas 108, 208 that have received a dose of ions during the various implantations are exposed during the etching.

Figure 3A:
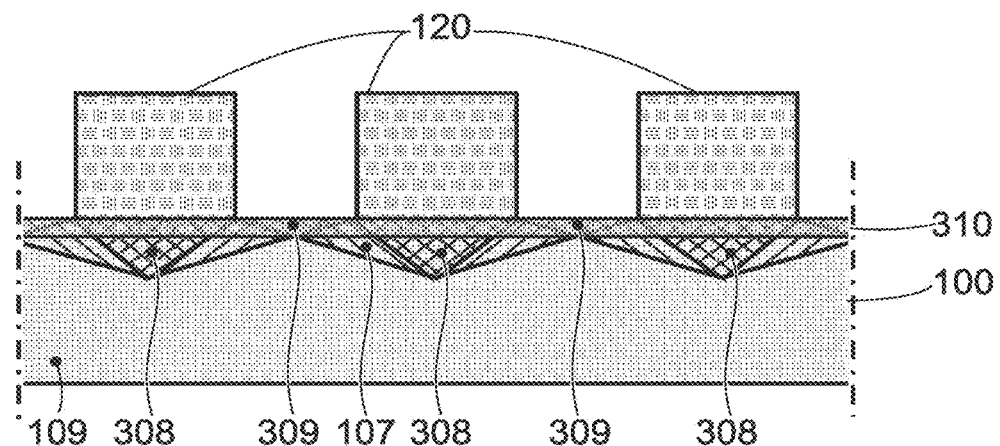
FIG. 3, comprised of FIGS. 3a to 3c, shows another embodiment for obtaining a structuring of the surface of a substrate, by using a sacrificial layer.
Figure 3B:
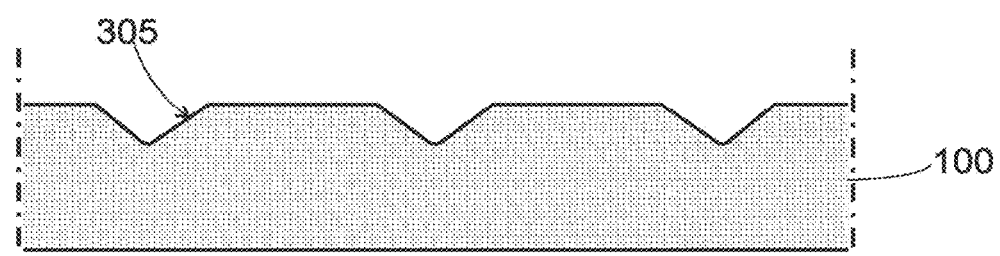
Figure 3C:
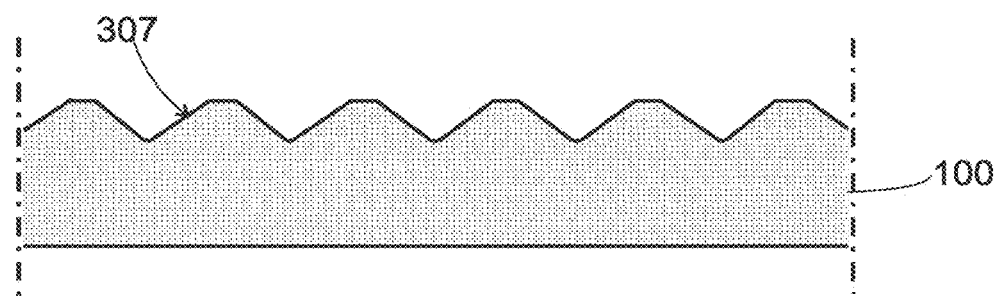

FIG. 3 comprised of FIGS. 3a to 3c shows another way to obtain a structuring of the surface of a substrate 100 according to the invention.

The particularity in this case consists in that before the formation of the patterns 120, a sacrificial layer 310 is formed on the substrate, of which the thickness is at least equal to the height of some areas that were implanted twice, here the areas 106.

The sacrificial layer 310 can for example be carried out using a material that is commonly used in lithography which is known under the acronym of BARC (bottom anti-reflective coating) and which constitutes a bottom anti-reflective coating for certain operations of lithography.

By adapting the thickness of the sacrificial layer 310 at the maximum height of implantation in the substrate of the areas 106 the latter can be included entirely in the layer 310. There will therefore not be in the case any implantation in the substrate 100 on the patterns 309. The areas implanted under the patterns 120, the deepest, here designated by the reference 308, will then have their depth limited somewhat.

For example this layer has a thickness of 20 to 50 nanometers ($10^{-9}$ meter). It is for example obtained via deposition. In this example the patterns 120 have a thickness between 1 nm and a few nanometers and the areas 308 have a depth also between 1 nm and a few nanometers, with the depth being measured perpendicularly to the surface of the substrate 100 and from the surface of the sacrificial layer 310 whereon the patterns 120 rest.

After removal of the patterns 120 and of the sacrificial layer 310 it is possible to proceed as hereinabove with a selective wet etching of the implanted areas 308. The regular profile 305 is then obtained shown in FIG. 3b.

This makes it possible to smooth the profile 305 obtained without having to carry out a thinning operation, such as a mechanical-chemical polishing in order to remove the shallowest reliefs.

If after etching and removal of the sacrificial layer 310, the implantation operations described in FIGS. 1a to 1d are repeated and after having formed new patterns 220 as explained in FIG. 2, a structuring of the surface 307 is then obtained after etching that is much denser. This is shown in FIG. 3c.

The following figures propose examples that will make it possible to determine the conditions for implementing the method of the invention intended to produce a structuring of the surface of a substrate such as shown in FIGS. 1e, 2c, 3b and 3c.

Figure 4A:
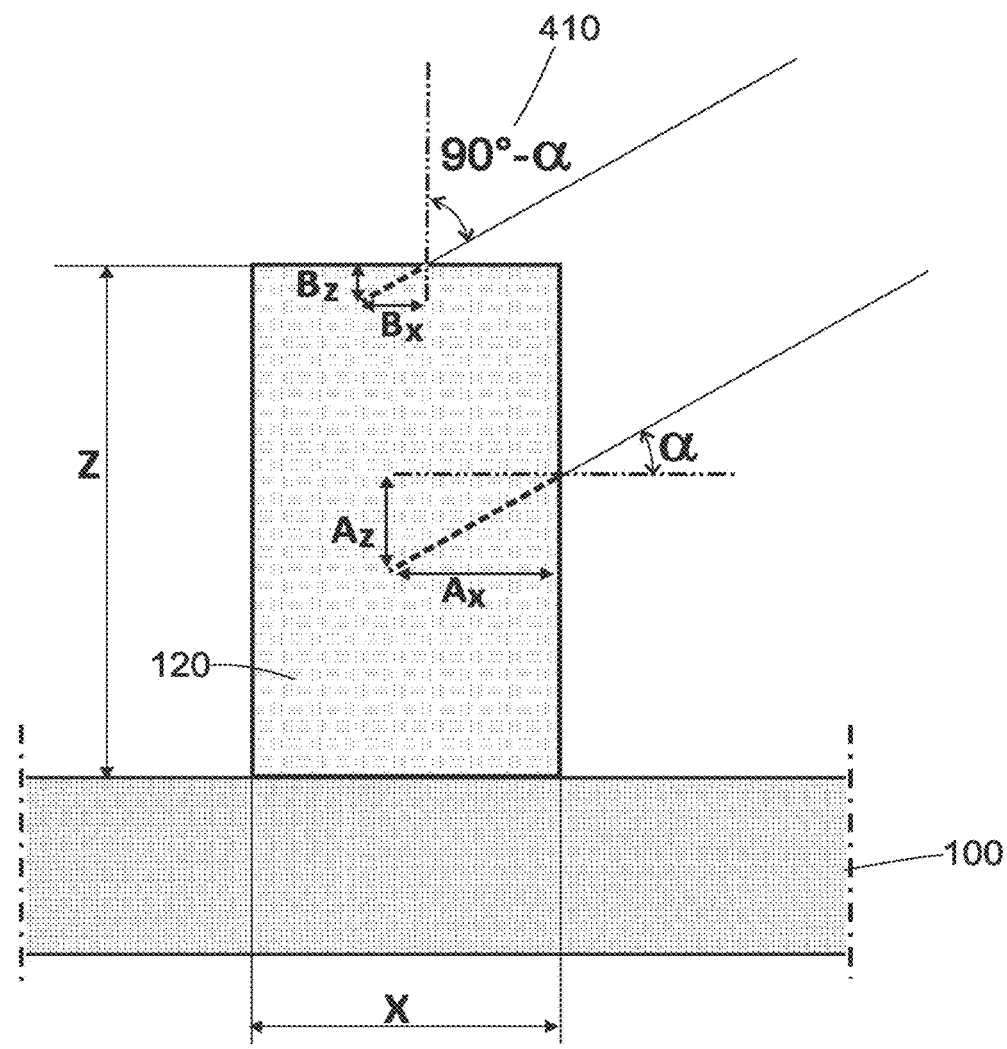
FIG. 4, comprised of FIGS. 4a to 4b, studies the penetration of ions into patterns made of resin of the mask.
Figure 4B:
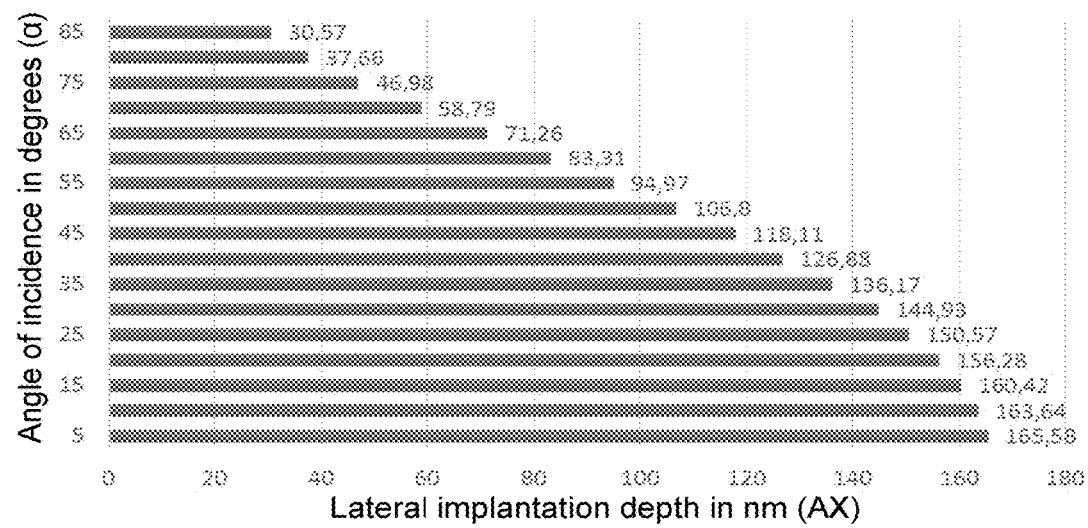

FIG. 4, comprised of FIGS. 4a and 4b, studies the penetration of ions into the resin patterns of the mask. FIG. 4a defined the following parameters:

α: is the angle of incidence of the beam on the flanks of the mask patterns 120. This direction of implantation is also designated by the references 112 and 132 in the preceding description of the invention. The inclination of the implantation with respect to the perpendicular to the plane of the substrate 100 to be structured is, as indicated 410, equal to: 90°−α;

$A_x$: is the modified depth in the resin via implantation according to a direction parallel to the plane of the substrate (X);

$B_z$: is the modified depth in the resin via implantation according to a direction perpendicular to the plane of the substrate (Z);

X: is the width of the pattern;

Z: is the height of the pattern.

As already indicated in the preceding description it is considered that the consumption of resin of the mask is not substantially affected by the implantation operation itself.

FIG. 4b shows, the lateral implantation depth (Ax) to the plane of the substrate 100 in the resin of the patterns 120 of the mask according to the angle of incidence (α). This figure shows the results of simulations that were carried out for a resin with a density equal to 1 gram per $cm^{-3}$ that has been subjected to an implantation of argon ions (Ar) with an energy of 100 keV and an implantation density of $10^{16}$ atoms per $cm^2$. The study of the penetration of the ions on the flanks of the patterns makes it possible to anticipate the surface modifications of the substrate 100 located under the mask.

Figure 5A:
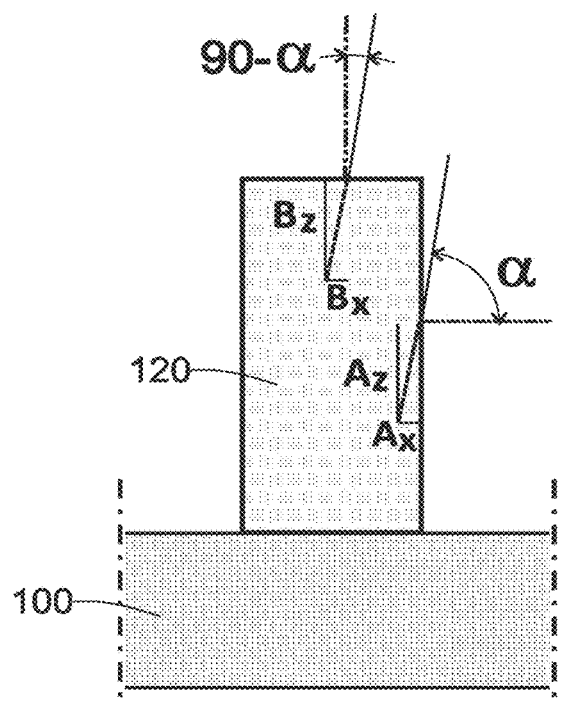
FIG. 5, comprised of FIGS. 5a to 5f, shows and discloses various options for adjusting the angle of incidence of the ion beam on the result of the implantation of species for the surface structuring of a substrate.
Figure 5B:
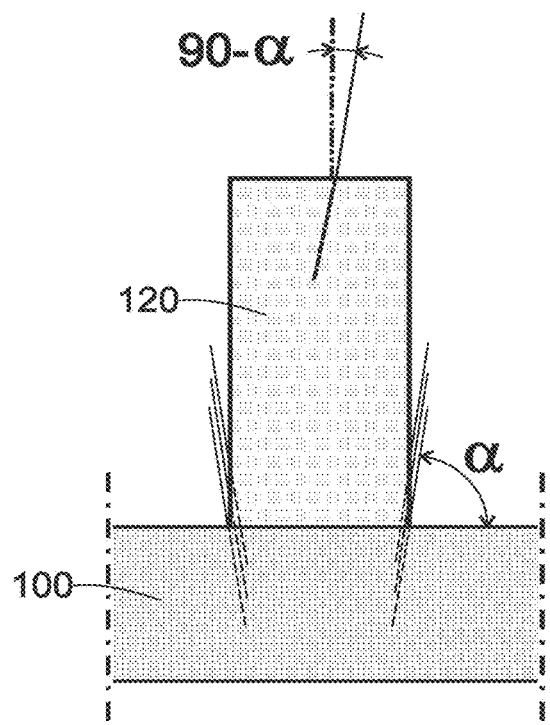
Figure 5F:
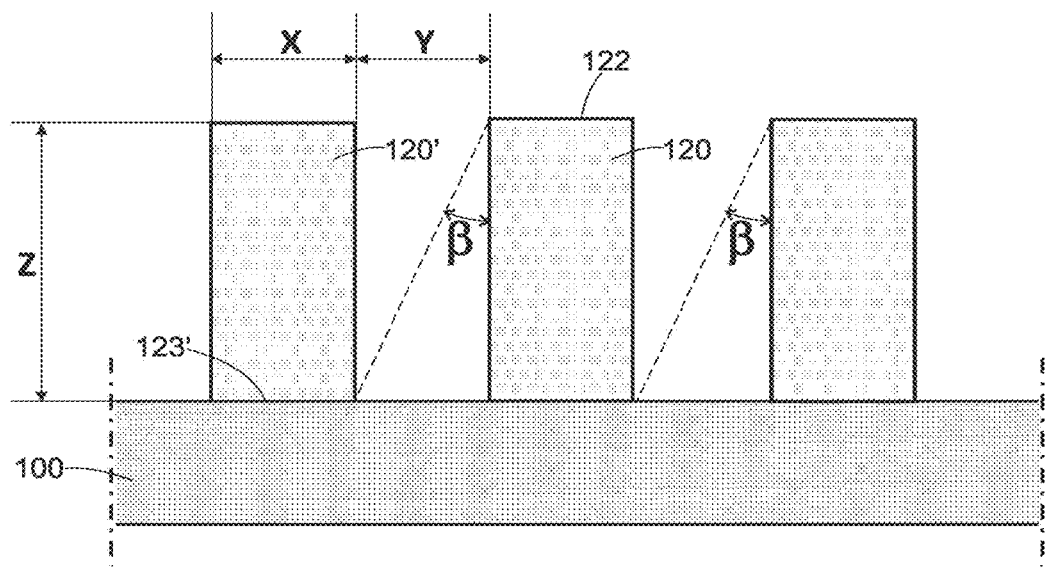

FIG. 5, comprised of FIGS. 5a to 5f, shows and discloses various options for adjusting the angle of incidence of the ion beam on the result of the implantation of species for the structuring of the surface of a substrate.

FIGS. 5a and 5b treat the case of an angle of incidence α greater than 45°. In this case, the beam penetrates the flanks of the patterns 120 under a high angle which induces only a slight lateral modification of the resin while a more significant modification can be observed at the top of the latter.

FIG. 5b shows the penetration of the beam in the substrate 100 underlying the pattern 120. In practice, it is noted that an implantation is effectively obtained under the mask of resin due for a large part to the inclination of the ion beam.

FIGS. 5c and 5d show the case where the angle of incidence α is less than 45°. The FIG. 5c shows the penetration of the ion beam in the pattern 120 made of resin and FIG. 5d the penetration of the latter into the material of the underlying substrate 100. In this case the lateral penetration of the ions is substantial, the correct compromise must however be found in order to reach the desired vertical depth.

FIG. 5e shows the case where the angle of incidence α is equal to 45°. This latter case makes it possible to both implant ions under the patterns 120 of the mask and also to reach an optimum depth in the material of the underlying substrate 100.

FIG. 5f shows how it is possible to determine the condition for which the unprotected areas, i.e. the inter-pattern areas of width Y, is not implanted. In the case the angle β must be greater than or equal to: arc tan(Y/Z).

The angle β is the angle formed by the intersection between the flank of a pattern 120 and the straight line passing through on the one hand the top 122 of this pattern 120 and on the other hand the base 123' of the pattern 120' adjacent to the pattern 120.

The curves of FIG. 4b combined with the condition hereinabove and with the discussions hereinabove shown in FIGS. 4a to 5e make it possible to define the angles to be used for implanting under the mask as well as the desired texturing.

In light of the preceding description, it clearly appears that the invention makes it possible to obtain in a reproducible and inexpensive manner patters or a texturing that has a possibly complex profile.

The invention is not limited to the embodiments that have been described hereinabove and extends to all the embodiments covered by the claims.

The invention claimed is:

1. A method for forming reliefs on the surface of a substrate, comprising at least the following steps:
   at least one first implantation of ions in the substrate according to a first direction;
   at least one second implantation of ions in the substrate according to a second direction that is different from the first direction;
   at least one of the first and second implantations is carried out through at least one mask having at least one pattern;
   an etching of areas of the substrate having received by implantation a dose greater than or equal to a threshold, selectively to the areas of the substrate that have not received via implantation a dose greater than said threshold;
   the parameters of the first and second implantations, including respective directions, being adjusted in such a way that only areas of the substrate that have been implanted both during the first implantation and during the second implantation receive a dose greater than or equal to said threshold.

2. The method according to claim 1, wherein the first and second implantations are each carried out through at least one mask.

3. The method according to claim 2, wherein the first and second implantations are carried out through the same mask, with the method comprising at least one additional implantation carried out through a mask that is different from the one used during the first and second implantations.

4. The method according to claim 2, wherein at least one pattern of the mask used during the first implantation is different from at least one pattern of the mask used during the second implantation.

5. The method according to claim 1, wherein at least one of the first and second implantations is carried out full wafer and without a mask.

6. The method according to claim 1, wherein a sacrificial layer is arranged above the substrate and wherein at least one among the first and the second implantations is carried out through said sacrificial layer.

7. The method according to claim 6, wherein the entire sacrificial layer is removed after the second implantation.

8. The method according to claim 6, wherein the sacrificial layer is an anti-reflective coating.

9. The method according to claim 6, wherein the thickness of the sacrificial layer is chosen and at least one among the first and the second implantations are carried out in such a way that first areas located under the mask are implanted both during the first implantation and during the second implantation, receive a dose greater than or equal to said threshold and extend solely in the sacrificial layer.

10. The method according to claim 6, wherein the thickness of the sacrificial layer as well as at least one among the first and the second implantations are carried out in such a way that second areas located under the mask are implanted both during the first implantation and during the second implantation by receiving a dose that is greater than or equal to said threshold, with said second regions extending in the sacrificial layer and in the substrate.

11. The method according to claim 1, wherein the substrate is crystalline and wherein at least one among the first and the second implantations is carried out in such a way as to render the implanted area amorphous.

12. The method according to claim 11, wherein said implantation taken from the first and the second implantations and carried out in such a way as to render the implanted areas amorphous comprises the implantation of ions that are heavier than hydrogen (H), such as boron, argon (Ar) or silicon ions with an energy that is sufficient to render the implanted areas amorphous.

13. The method according to claim 11, wherein at least one among the first and the second implantations is carried out in such a way as to chemically modify the substrate and wherein said implantation carried out in such a way as to render the implanted areas amorphous is the first implantation and wherein said implantation carried out in such a way as to chemically modify the substrate is the second implantation.

14. The method according to claim 1, wherein at least one among the first and the second implantations is carried out in such a way as to chemically modify the substrate.

15. The method according to claim 14, wherein said implantation taken from the first and the second implantations and carried out in such a way as to chemically modify the substrate comprises the implantation of hydrogen (H) and/or of oxygen ions in order to chemically modify the substrate.

16. The method according to claim 1, wherein at least some of the areas receiving a dose greater than or equal to said threshold are located under a pattern of the mask during at least one of the first and second implantations.

17. The method according to claim 1, wherein at least one of the first and second directions of implantation is perpendicular to a main plane in which extends the substrate.

18. The method according to claim 1, wherein the directions of implantation of the first implantation and of the second implantation are inclined with respect to a direction perpendicular to a main plane in which extends the substrate.

19. The method according to claim 1, wherein the substrate is made from a material comprising at least one of the following materials: silicon (Si), silicon-germanium (SiGe), sapphire, SiC, GaN or quartz.

20. The method according to claim 1, wherein the substrate is porous.

21. The method according to claim 1, wherein the parameters of the first and second implantations, in particular their respective directions, are adjusted in such a way that some areas of the substrate do not receive any dose during at least one among the first and the second implantations.

22. The method according to claim 1, wherein the parameters of the first and second implantations, in particular their respective directions, are adjusted in such a way that during at least one among the first and the second implantations, ions penetrate into the substrate without passing through the mask.

* * * * *